United States Patent
Wang et al.

(10) Patent No.: US 8,912,524 B2
(45) Date of Patent: Dec. 16, 2014

(54) DEFECT GRADIENT TO BOOST NONVOLATILE MEMORY PERFORMANCE

(71) Applicants: SanDisk 3D LLC, Milpitas, CA (US); Kabushiki Kaisha Toshiba, Tokyo (JP)

(72) Inventors: Yun Wang, San Jose, CA (US); Tony Chiang, Campbell, CA (US); Imran Hashim, Saratoga, CA (US)

(73) Assignees: SanDisk 3D LLC, Milpitas, CA (US); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/075,036

(22) Filed: Nov. 8, 2013

(65) Prior Publication Data

US 2014/0084237 A1    Mar. 27, 2014

Related U.S. Application Data

(62) Division of application No. 13/223,950, filed on Sep. 1, 2011, now Pat. No. 8,659,001.

(51) Int. Cl.
*H01L 47/00*      (2006.01)
*H01L 45/00*      (2006.01)
*H01L 27/24*      (2006.01)

(52) U.S. Cl.
CPC .............. *H01L 45/122* (2013.01); *H01L 45/08* (2013.01); *H01L 45/146* (2013.01); *H01L 27/2463* (2013.01); *H01L 45/1608* (2013.01)
USPC ................ 257/4; 257/2; 257/5; 257/E45.001; 257/E45.003

(58) Field of Classification Search
USPC ....................... 257/2, 4, 5, E45.001, E45.003
See application file for complete search history.

(56) References Cited

U.S. PATENT DOCUMENTS

| | | |
|---|---|---|
| 5,311,039 A | 5/1994 | Kimura et al. |
| 5,373,169 A | 12/1994 | McCollum et al. |
| 5,379,250 A | 1/1995 | Harshfield |

(Continued)

FOREIGN PATENT DOCUMENTS

| | | |
|---|---|---|
| JP | 08-316324 | 11/1996 |
| JP | 2005-123575 | 5/2005 |
| WO | 2005124787 | 12/2005 |

OTHER PUBLICATIONS

Notice of Allowance and Fee(s) Due dated Oct. 8, 2013 in U.S. Appl. No. 13/309,813.

(Continued)

*Primary Examiner* — Andy Huynh
(74) *Attorney, Agent, or Firm* — Vierra Magen Marcus LLP

(57) ABSTRACT

Embodiments of the present invention generally relate to a resistive switching nonvolatile memory element that is formed in a resistive switching memory device that may be used in a memory array to store digital data. The memory element is generally constructed as a metal-insulator-metal stack. The resistive switching portion of the memory element includes a getter and/or a defect portion. In general, the getter portion is an area of the memory element that is used to help form, during the resistive switching memory device's fabrication process, a region of the resistive switching layer that has a greater number of vacancies or defects compared to the remainder of resistive switching layer. The defect portion is an area of the memory element that has a greater number of vacancies or defects compared to the remainder of the resistive switching layer, and is formed during the resistive switching memory device's fabrication process.

20 Claims, 6 Drawing Sheets

(56) References Cited

U.S. PATENT DOCUMENTS

| | | |
|---|---|---|
| 5,475,253 A | 12/1995 | Look et al. |
| 5,486,707 A | 1/1996 | Look et al. |
| 5,688,158 A | 11/1997 | Jones et al. |
| 5,818,749 A | 10/1998 | Harshfield |
| 5,915,167 A | 6/1999 | Leedy |
| 6,034,882 A | 3/2000 | Johnson et al. |
| 6,100,120 A | 8/2000 | Yu |
| 6,306,715 B1 | 10/2001 | Chan et al. |
| 6,342,414 B1 | 1/2002 | Xiang et al. |
| 6,351,406 B1 | 2/2002 | Johnson et al. |
| 6,369,421 B1 | 4/2002 | Xiang et al. |
| 6,376,787 B1 | 4/2002 | Martin et al. |
| 6,403,434 B1 | 6/2002 | Yu |
| 6,420,215 B1 | 7/2002 | Knall et al. |
| 6,426,891 B1 | 7/2002 | Katori |
| 6,434,060 B1 | 8/2002 | Tran et al. |
| 6,451,641 B1 | 9/2002 | Halliyal et al. |
| 6,451,647 B1 | 9/2002 | Yang et al. |
| 6,455,424 B1 | 9/2002 | McTeer et al. |
| 6,456,524 B1 | 9/2002 | Perner et al. |
| 6,465,804 B1 | 10/2002 | Shamir |
| 6,475,874 B2 | 11/2002 | Xiang et al. |
| 6,483,734 B1 | 11/2002 | Sharma et al. |
| 6,486,065 B2 | 11/2002 | Vyvoda et al. |
| 6,490,218 B1 | 12/2002 | Vyvoda et al. |
| 6,492,241 B1 | 12/2002 | Rhodes et al. |
| 6,495,437 B1 | 12/2002 | Yu |
| 6,514,808 B1 | 2/2003 | Samavedam et al. |
| 6,515,888 B2 | 2/2003 | Johnson et al. |
| 6,525,953 B1 | 2/2003 | Johnson |
| 6,534,403 B2 | 3/2003 | Cleeves |
| 6,534,841 B1 | 3/2003 | Van Brocklin et al. |
| 6,549,447 B1 | 4/2003 | Fricke et al. |
| 6,551,885 B1 | 4/2003 | Yu |
| 6,552,409 B2 | 4/2003 | Taussig et al. |
| 6,559,014 B1 | 5/2003 | Jeon |
| 6,574,145 B2 | 6/2003 | Kleveland et al. |
| 6,579,760 B1 | 6/2003 | Lung |
| 6,580,115 B2 | 6/2003 | Agarwal |
| 6,586,349 B1 | 7/2003 | Jeon et al. |
| 6,587,394 B2 | 7/2003 | Hogan |
| 6,617,639 B1 | 9/2003 | Wang et al. |
| 6,661,691 B2 | 12/2003 | Fricke et al. |
| 6,686,646 B2 | 2/2004 | Lee |
| 6,689,644 B2 | 2/2004 | Johnson |
| 6,690,597 B1 | 2/2004 | Perlov et al. |
| 6,704,235 B2 | 3/2004 | Knall et al. |
| 6,750,079 B2 | 6/2004 | Lowrey |
| 6,753,561 B1 | 6/2004 | Rinerson et al. |
| 6,784,517 B2 | 8/2004 | Kleveland et al. |
| 6,816,410 B2 | 11/2004 | Kleveland et al. |
| 6,822,888 B2 | 11/2004 | Peng |
| 6,842,369 B2 | 1/2005 | Koll et al. |
| 6,879,505 B2 | 4/2005 | Scheuerlein |
| 6,906,361 B2 | 6/2005 | Zhang |
| 6,937,507 B2 | 8/2005 | Chen |
| 6,937,509 B2 | 8/2005 | Perner et al. |
| 6,937,528 B2 | 8/2005 | Hush et al. |
| 6,952,030 B2 | 10/2005 | Herner et al. |
| 7,009,694 B2 | 3/2006 | Hart et al. |
| 7,012,297 B2 | 3/2006 | Bhattacharyya |
| 7,052,941 B2 | 5/2006 | Lee |
| 7,172,840 B2 | 2/2007 | Chen |
| 7,176,064 B2 | 2/2007 | Herner |
| 7,206,214 B2 | 4/2007 | Hoefler et al. |
| 7,271,081 B2 | 9/2007 | Li et al. |
| 7,303,971 B2 | 12/2007 | Hsu et al. |
| 7,304,888 B2 | 12/2007 | Knall |
| 7,405,465 B2 | 7/2008 | Herner |
| 7,410,838 B2 | 8/2008 | Ang |
| 7,453,755 B2 | 11/2008 | Cleeves |
| 7,575,984 B2 | 8/2009 | Radigan et al. |
| 7,608,514 B2 | 10/2009 | Hsu |
| 7,629,198 B2 | 12/2009 | Kumar et al. |
| 7,633,108 B2 | 12/2009 | Li et al. |
| 7,649,768 B2 | 1/2010 | Hirose |
| 7,706,169 B2 | 4/2010 | Kumar |
| 7,863,598 B2 | 1/2011 | Sugita et al. |
| 7,875,871 B2 | 1/2011 | Kumar |
| 7,920,408 B2 | 4/2011 | Azuma et al. |
| 7,968,419 B2 | 6/2011 | Li et al. |
| 8,058,636 B2 | 11/2011 | Osano et al. |
| 8,072,795 B1 | 12/2011 | Wang et al. |
| 8,093,682 B2 | 1/2012 | Hirose |
| 8,148,711 B2 | 4/2012 | Fujii et al. |
| 8,183,553 B2 | 5/2012 | Phatak et al. |
| 8,279,657 B2 | 10/2012 | Takagi et al. |
| 8,339,834 B2 | 12/2012 | Nakai et al. |
| 8,343,813 B2 | 1/2013 | Kuse et al. |
| 8,410,467 B2 | 4/2013 | Wada |
| 8,558,208 B2 * | 10/2013 | Fujitsuka et al. ............... 257/2 |
| 8,592,798 B2 * | 11/2013 | Mikawa et al. ............... 257/4 |
| 2002/0019039 A1 | 2/2002 | Davis et al. |
| 2002/0070754 A1 | 6/2002 | Lambertson |
| 2002/0086476 A1 | 7/2002 | Kim et al. |
| 2003/0026158 A1 | 2/2003 | Knall et al. |
| 2003/0062595 A1 | 4/2003 | Anthony |
| 2003/0081445 A1 | 5/2003 | Van Brocklin et al. |
| 2003/0169625 A1 | 9/2003 | Hush et al. |
| 2004/0002184 A1 | 1/2004 | Cleeves |
| 2004/0016991 A1 | 1/2004 | Johnson et al. |
| 2004/0108573 A1 | 6/2004 | Herner et al. |
| 2004/0183144 A1 | 9/2004 | Beaman et al. |
| 2004/0245547 A1 | 12/2004 | Stipe |
| 2005/0014322 A1 | 1/2005 | Herner et al. |
| 2005/0026334 A1 | 2/2005 | Knall |
| 2005/0052915 A1 | 3/2005 | Herner et al. |
| 2005/0098800 A1 | 5/2005 | Herner et al. |
| 2005/0121742 A1 | 6/2005 | Petti et al. |
| 2005/0121743 A1 | 6/2005 | Herner |
| 2005/0124116 A1 | 6/2005 | Hsu |
| 2005/0221200 A1 | 10/2005 | Chen |
| 2005/0226067 A1 | 10/2005 | Herner et al. |
| 2006/0073642 A1 | 4/2006 | Yeh et al. |
| 2006/0076549 A1 | 4/2006 | Ufert |
| 2006/0171200 A1 | 8/2006 | Rinerson et al. |
| 2006/0197115 A1 | 9/2006 | Toda |
| 2006/0197180 A1 | 9/2006 | Lai et al. |
| 2006/0203541 A1 | 9/2006 | Toda |
| 2006/0249753 A1 | 11/2006 | Herner et al. |
| 2006/0250837 A1 | 11/2006 | Herner et al. |
| 2006/0252281 A1 | 11/2006 | Park et al. |
| 2006/0268594 A1 | 11/2006 | Toda |
| 2006/0273298 A1 | 12/2006 | Petti et al. |
| 2007/0008773 A1 | 1/2007 | Scheuerlein |
| 2007/0015330 A1 | 1/2007 | Li et al. |
| 2007/0015348 A1 | 1/2007 | Hsu et al. |
| 2007/0069241 A1 | 3/2007 | Yang et al. |
| 2007/0072360 A1 | 3/2007 | Kumar et al. |
| 2007/0087508 A1 | 4/2007 | Herner |
| 2007/0190722 A1 | 8/2007 | Herner |
| 2007/0228414 A1 | 10/2007 | Kumar et al. |
| 2007/0228442 A1 | 10/2007 | Kakimoto |
| 2008/0025078 A1 | 1/2008 | Scheuerlein et al. |
| 2008/0090337 A1 | 4/2008 | Williams |
| 2008/0128853 A1 | 6/2008 | Choi et al. |
| 2008/0219039 A1 | 9/2008 | Kumar et al. |
| 2008/0239790 A1 | 10/2008 | Herner et al. |
| 2009/0003036 A1 | 1/2009 | Kumar |
| 2009/0026434 A1 | 1/2009 | Malhotra et al. |
| 2009/0085154 A1 | 4/2009 | Herner et al. |
| 2009/0086521 A1 | 4/2009 | Herner et al. |
| 2009/0101965 A1 | 4/2009 | Chen et al. |
| 2009/0168492 A1 | 7/2009 | Thorp et al. |
| 2009/0227067 A1 | 9/2009 | Kumar et al. |
| 2009/0256130 A1 | 10/2009 | Schricker |
| 2009/0257270 A1 | 10/2009 | Schricker et al. |
| 2009/0272959 A1 | 11/2009 | Phatak et al. |
| 2009/0272961 A1 | 11/2009 | Miller et al. |
| 2009/0272962 A1 | 11/2009 | Kumar et al. |
| 2009/0283736 A1 | 11/2009 | Kanzawa et al. |
| 2010/0072451 A1 | 3/2010 | Terao et al. |
| 2010/0085794 A1 | 4/2010 | Chen et al. |
| 2010/0265750 A1 | 10/2010 | Yan et al. |

(56) References Cited

U.S. PATENT DOCUMENTS

| | | |
|---|---|---|
| 2011/0002154 A1 | 1/2011 | Mitani et al. |
| 2011/0037043 A1 | 2/2011 | Wada |
| 2011/0062557 A1 | 3/2011 | Bandyopadhyay et al. |
| 2011/0069532 A1 | 3/2011 | Ichihara et al. |
| 2011/0085370 A1 | 4/2011 | Chen et al. |
| 2011/0089391 A1 | 4/2011 | Mihnea et al. |
| 2011/0140762 A1 | 6/2011 | Jiang et al. |
| 2011/0149634 A1 | 6/2011 | Schloss et al. |
| 2011/0194329 A1 | 8/2011 | Ohba et al. |
| 2011/0310653 A1 | 12/2011 | Kreupl |
| 2011/0310654 A1 | 12/2011 | Kreupl |
| 2011/0310655 A1 | 12/2011 | Kreupl |
| 2011/0310656 A1 | 12/2011 | Kreupl |
| 2012/0018695 A1 | 1/2012 | Lee et al. |
| 2012/0025164 A1 | 2/2012 | Deweerd et al. |
| 2012/0091419 A1 | 4/2012 | Chen et al. |
| 2012/0091427 A1 | 4/2012 | Chen et al. |
| 2012/0170353 A1 | 7/2012 | Iijima et al. |
| 2012/0193600 A1* | 8/2012 | Himeno et al. ............ 257/4 |
| 2012/0295413 A1* | 11/2012 | Fujii et al. ............... 438/382 |
| 2012/0313063 A1 | 12/2012 | Wang et al. |
| 2012/0313069 A1* | 12/2012 | Wang et al. ............... 257/4 |
| 2013/0026438 A1 | 1/2013 | Wang et al. |
| 2013/0028003 A1 | 1/2013 | Wang et al. |
| 2013/0065377 A1 | 3/2013 | Gopal et al. |
| 2013/0140512 A1 | 6/2013 | Chen et al. |
| 2013/0140514 A1* | 6/2013 | Mikawa et al. ............ 257/4 |
| 2013/0148404 A1 | 6/2013 | Bandyopadhyay et al. |

OTHER PUBLICATIONS

Nardi, F. et al., "Control of Filament Size and Reduction of Reset Current Below 10 uA in NiO Resistance Switching Memories," Academia—Politecnico di Milano; Solid-State Electronics 58, 2011 pp. 42-47.

Tirano, S. et al., "Accurate Analysis of Parasitic Current Overshoot During Forming Operation in RRAMs,"CEA-LETI, France; Microelectronic Engineering 88, 2011, pp. 1129-1132.

Hierber, K., "Amorphous Chromium-Silicon: A Material for Kilo-Ohn Sheet Resistances, Siemens Aktiengesellschaft," Thin Solid Films, 57 (1979), pp. 353-357.

Wang, J. et al., "Thin Film Embedded Resistors," Gould Electronics, 6 pages.

Chen, C. et al., "Nitrogen Implanted Polysilicon Resistor for High-Voltage CMOS Technology Application," Academia—National Cheng Kung University, Taiwan; IEEE Electron Device Letters vol. 22 No. 11; Nov. 2011, pp. 524-526.

Chen, A., "Current Overshoot During Set and Reset Operations of Resistive Switching Memories," IEEE; 2012, pp. MY2.1-MY2.4.

Nardi, F. et al., "Reset Current Reduction and Set-Reset Instabilities in Unipolar NiO RRAM," IEEE, 2011, 4 pages.

Final Office Action dated Aug. 29, 2013 in U.S. Appl. No. 13/399,530.

Notice of Allowance and Fee(s) Due dated Aug. 5, 2013, in U.S. Appl. No. 13/399,815.

Notice of Allowance and Fee(s) Due dated Sep. 4, 2013 in U.S. Appl. No. 13/309,813.

Notice of Allowance and Fee(s) Due dated Sep. 16, 2013 in U.S. Appl. No. 13/354,006.

Office Action dated Sep. 12, 2013 in U.S. Appl. No. 13/314,580.

Muller et al., "Device Electronics for Integrated Circuits, Second Edition", John Wiley & Sons, Inc., (1986), 192-200.

Li et al., "Evaluation of SiO2 Antifuse in a 3D-OTP Memory", IEEE Transactions on Device and Materials Reliability, vol. 4, No. 3, Sep. 2004, pp. 416-421.

Herner et al., "Vertical p-i-n Polysilicon Diode with Antifuse for Stackable Field-Programmable ROM," IEEE Electron Device Letters, vol. 25, No. 5, May 2004, pp. 271-273.

Herner et al., "Polycrystalline Silicon/CoSi2 Schottky Diode with Integrated SiO2 Antifuse: A Nonvolatile Memory Cell," Applied Physics Letters, vol. 82, No. 23, 2004, 4163-4165.

McPherson et al., "Proposed Universal Relationship Between Dielectric Breakdown and Dielectric Constant," IEEE International Electron Devices Meeting, 2002, pp. 26.6.1-26.6.4.

McPherson et al., "Trends in the Ultimate Breakdown Strength of High Dielectric-Constant Materials", IEEE Transactions on Electron Devices, vol. 50, No. 8, (Aug. 2003), 1771-1778.

King, et al., "Punchthrough Diode as the Transient Voltage Suppressor for Low-Voltage Electronics", Nov. 1, 1996, 4 pages, vol. 43, No. 11, IEEE Transactions on Electron Devices, IEEE Service Center, Piscataway, NJ, USA.

Chen et al. U.S. Appl. No. 13/465,263, filed May 7, 2012 (SD-MXA-442).

Herner et al., "Vertical p-i-n Polysilicon Memory Switching: Electrothermal-Induced Order," IEEE Trans. Electron Devices, 53.9, pp. 2320-2327, Sep. 2006.

Bandyopadhyay et al., U.S. Appl. No. 13/780,089, (SD-MXA-274) filed Feb. 28, 2013.

Tendulkar et al., U.S. Appl. No. 13/354,006, (SD-IMA-004-US) filed Jan. 19, 2012.

Tendulkar et al., U.S. Appl. No. 13/399,815, (SD-IMA-005-US) filed Feb. 17, 2012.

Meyer, R., et al. "Oxide Dual-Layer Memory Element for Scalable Non-Volatile Cross-Point Memory Technology," 9th Annual, Non-Volatile Memory Technology Symposium, Nov. 11-14, 2008, pp. 54-58.

L.M. Levinson, "Electronic Ceramics: Properties, Devices, and Applications," (1998), p. 293.

Phatak et al., U.S. Appl. No. 13/189,065, (IM0210_US) filed Oct. 6, 2011.

Guo, X., et al., "Tunneling Leakage Current in Oxynitride: Dependence on Oxygen/Nitrogen Content," Yale University (New Haven, CT), IEEE Electron Device Letters vol. 19, No. 6, Jun. 1998, pp. 207-209.

Final Office Action dated Oct. 24, 2013 in U.S. Appl. No. 13/465,263.

Response to Office Action filed Oct. 28, 2013 in U.S. Appl. No. 13/399,530.

U.S. Appl. No. 14/075,036, filed Nov. 8, 2013.

Notice of Allowance and Fee(s) Due dated Nov. 20, 2013 in U.S. Appl. No. 13/354,006.

Notice of Allowance and Fee(s) Due dated Nov. 1, 2013 in U.S. Appl. No. 13/353,000.

Notice of Allowance and Fee(s) Due dated Nov. 4, 2013 in U.S. Appl. No. 13/399,815.

Restriction Requirement dated Jan. 25, 2013 in U.S. Appl. No. 13/223,950.

Response to Restriction Requirement filed Jan. 28, 2013 in U.S. Appl. No. 13/223,950.

Office Action dated Feb. 12, 2013 in U.S. Appl. No. 13/223,950.

Response to Office Action filed May 7, 2013 in U.S. Appl. No. 13/223,950.

Notice of Allowance and Fee(s) Due dated May 29, 2013 in U.S. Appl. No. 13/223,950.

Notice of Allowance And Fee(s) Due dated Oct. 17, 2013 in U.S. Appl. No. 13/223,950.

Response to Office Action filed Dec. 12, 2013 in U.S. Appl. No. 13/314,580.

Office Action dated Feb. 27, 2014 in U.S. Appl. No. 13/465,263.

Final Office Action dated Mar. 6, 2014 in U.S. Appl. No. 13/314,580.

U.S. Appl. No. 14/133,107, filed Dec. 18, 2013.

Restriction Requirement dated Jan. 16, 2014 in U.S. Appl. No. 13/228,744.

Response to Restriction Requirement filed Jan. 28, 2014 in U.S. Appl. No. 13/228,744.

Response to Office Action filed Jan. 24, 2014 in U.S. Appl. No. 13/465,263.

U.S. Appl. No. 14/176,882, filed Feb. 10, 2014.

U.S. Appl. No. 14/183,816, filed Feb. 19, 2014.

Office Action dated Feb. 21, 2014 in U.S. Appl. No. 13/228,744.

Response to Office Action filed Jul. 2, 2014 in U.S. Appl. No. 14/176,882.

Notice of Allowance and Fee(s) Due dated Jul. 24, 2014 in U.S. Appl. No. 14/176,882.

(56) References Cited

OTHER PUBLICATIONS

Response to Office Action filed Jul. 22, 2014 in U.S. Appl. No. 14/183,816.
Notice of Allowance and Fee(s) Due dated Jul. 24, 2014 in U.S. Appl. No. 13/399,530.
International Search Report and Written Opinion dated Jul. 3, 2014 in International Patent Application No. PCT/US2014/018123.
Office Action dated Apr. 11, 2014 in U.S. Appl. No. 14/176,882.
Office Action dated Apr. 24, 2014 in U.S. Appl. No. 14/183,816.
Response to Final Office Action filed Apr. 25, 2014 in U.S. Appl. No. 13/314,580.
Notice of Allowance and Fee(s) Due dated May 2, 2014 in U.S. Appl. No. 13/399,530.
Advisory Action dated May 12, 2014 in U.S. Appl. No. 13/314,580.
Office Action dated Jun. 4, 2014 in U.S. Appl. No. 14/133,107.
Communication pursuant to Rules 161(2) and 162 EPC dated Aug. 6, 2014 in European Patent Application No. 112853845.1.
U.S. Appl. No. 14/458,295, filed Aug. 13, 2014.
Response to Office Action filed Sep. 4, 2014 in U.S. Appl. No. 14/133,107.
Notice of Allowance and Fee(s) Due dated Sep. 19, 2014 Jul. 24, 2014 in U.S. Appl. No. 14/183,816.

* cited by examiner

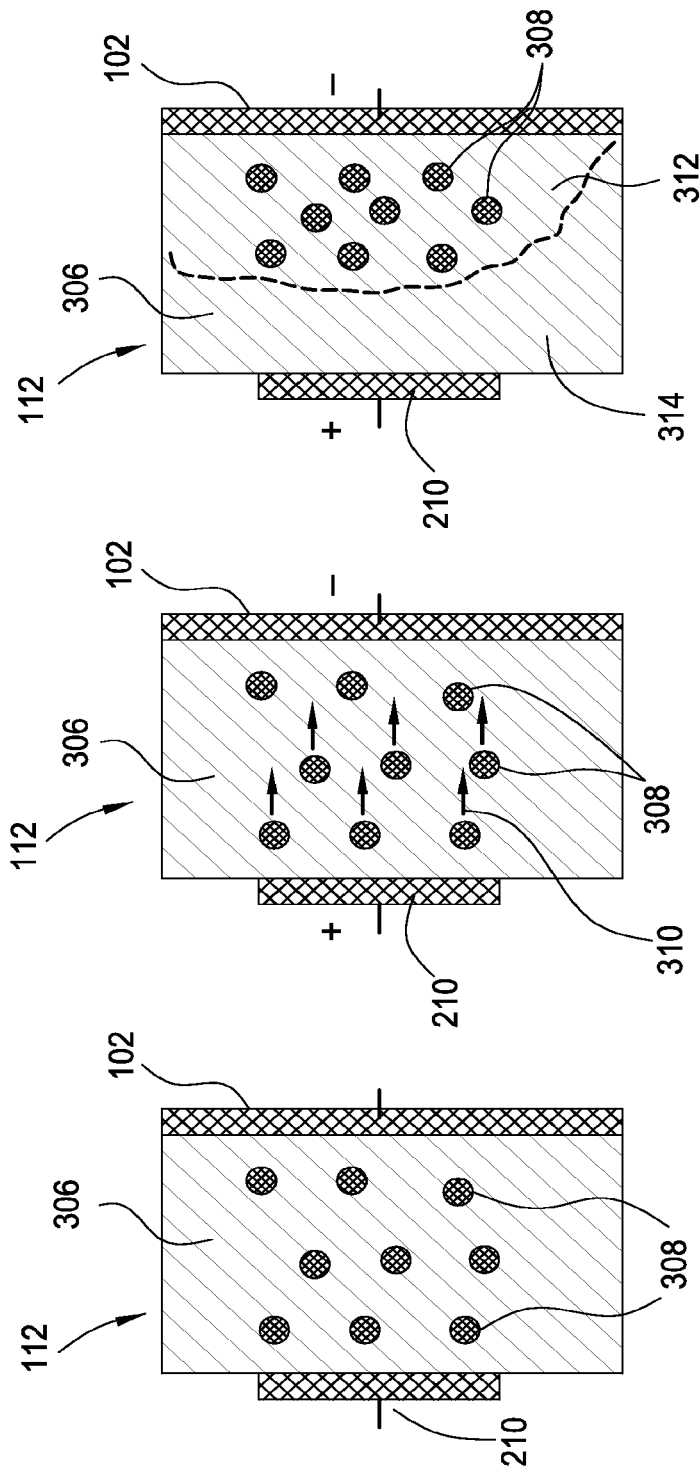

DEFECT GRADIENT TO BOOST NONVOLATILE MEMORY PERFORMANCE

PRIORITY DATA

This application is a divisional of U.S. patent application Ser. No. 13/223,950 filed Sep. 1, 2011, now U.S. Pat. No. 8,659,001.

BACKGROUND

This invention relates to nonvolatile memory elements, and more particularly, to methods for forming resistive switching memory elements used in nonvolatile memory devices.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide (MO) films has been demonstrated. Although metal oxide (MO) films such as these exhibit bistability, the resistance of these films and/or the ratio of the high-to-low resistance states is (are) often insufficient to be of use within a practical nonvolatile memory device. For instance, the resistance states of the metal oxide film should preferably be significant as compared to that of the system (e.g., the memory device and associated circuitry) so that any change in the resistance state change is perceptible. Since the variation in the difference between the high and low resistive states is related to the resistance of the resistive switching layer, variations in the magnitude of the difference between states and differences between the states throughout the life of the device is often not desirable. Moreover, in cases where multiple formed memory devices are interconnected to each other and to other circuit elements, it is desirable to minimize the device performance variation between one device to the next to assure that the performance of the formed circuit performs in a desirable manner.

Thus, in a conventional resistive switching memory device manufacturing process, additional post fabrication processing steps are commonly required to assure that the resistive state change or resistive switching properties of the memory device do not vary with time and have a sufficiently perceptible difference between the bi-stable states. Typically, these additional processing steps include an "electrical forming" process that requires the application of a forming voltage at least once across the memory device to "burn-in" the device.

However, it is desirable to minimize and/or eliminate the need for these post processing steps to reduce the added complexity of the manufacturing process created by the addition of the post processing steps, reduce the length of the memory device manufacturing process and reduce the possibility of physically harming the material found in the resistance switching layer by the application of the often high electrical currents that are required during the "electrical forming" type post processing steps.

Therefore, there is a need for a resistive switching memory device that does not require the use of these post processing steps, such as the "electrical forming" type post processing step, and has consistent and improved resistive switching characteristics.

SUMMARY

Embodiments of the present invention generally relate to a resistive switching nonvolatile memory element. The memory element can be constructed as a metal-insulator-metal stack. The variable resistance layer portion, which generally comprises a dielectric material, is arranged to have either a defect portion or a getter portion or interleaved combinations thereof. An example of a getter portion is an oxygen getter material or a nitrogen getter material. The getter portion is a material that will preferentially combine with freely available ions (such as nitrogen or oxygen ions). In other words, the getter portion has an affinity for freely available ions and reacts with the freely available ions to create vacancies (caused by the ion removal to the getter portion), which concentrate in an area adjacent the getter portion. An example of a defect portion is a sub-stoichiometric metal oxide. A sub-stoichiometric metal oxide is oxygen deficient and thus, has a greater ability to enable or inhibit vacancy movement needed to cause the resistive switching of the memory device as compared to an adjacent stoichiometric dielectric portion.

The defect or getter portion permits the memory element to be fabricated either without an electro-forming process to precondition the memory element or at the very least reduce the required magnitude of the forming voltage or current. As will be discussed below, both the getter portion and the defect portion may be arranged as either single layers, or as layers that are interleaved with themselves or other dielectric layers.

Embodiments of the invention generally relate to a nonvolatile memory element, comprising a first electrode layer, a variable resistance layer disposed over the first electrode layer, wherein the variable resistance layer comprises a first material that comprises a first chemical element and has an average vacancy concentration, and a getter layer disposed on the variable resistance layer, and having a greater affinity for the first chemical element as compared to the first material in the variable resistance layer, wherein a region of the variable resistance layer adjacent to the getter layer has a greater concentration of vacancies than the average vacancy concentration.

Embodiments of the invention may further provide a nonvolatile memory element, comprising a first electrode, a first variable resistance layer disposed over the first electrode, and having a first thickness, a first getter layer disposed on the first variable resistance layer, a second variable resistance layer disposed on the first getter layer, and having a second thickness, and a second getter layer disposed on the second variable resistance layer.

Embodiments of the invention may further provide a nonvolatile memory element, comprising a first electrode, and a variable resistance layer comprising a first layer disposed over the first electrode, wherein the first layer comprises a first material that comprises two or more chemical elements, and a second layer disposed on the first layer, wherein the second layer comprises a second material that comprises the same two or more chemical elements as the first material, the stoichiometry of the two or more chemical elements in the first material is different than the stoichiometry of the two or more chemical elements in the second material, and the second material has a greater concentration of vacancies than the first material.

Embodiments of the invention may further provide a method of forming a nonvolatile memory element, comprising depositing a first electrode layer over a surface of a substrate, depositing a first variable resistance layer over the first electrode layer, wherein the first variable resistance layer comprises a first material that has a first vacancy density formed therein, and comprises a first chemical element, depositing a first getter layer on the first variable resistance layer, wherein the first getter layer has a greater affinity for the first chemical element as compared to the first material in the first variable resistance layer, and forming vacancies in a region of the first variable resistance layer adjacent to the first getter layer, wherein a vacancy density in the region of the first variable resistance layer is greater than the first vacancy density.

Embodiments of the invention may further provide a method of forming a nonvolatile memory element, comprising depositing a first electrode layer over a surface of a substrate, depositing a first variable resistance layer over the first electrode layer, wherein the first variable resistance layer comprises a first material that has a first vacancy or defect density formed therein, and depositing a second variable resistance layer over the first variable resistance layer, wherein the second variable resistance layer comprises a second material that has a second vacancy or defect density that is greater than the first vacancy or defect density.

Embodiments of the invention may further provide a resistive nonvolatile memory element that includes a first electrode, a stoichiometric metal oxide layer disposed on the first electrode, a non-stoichiometric metal oxide layer disposed on the stoichiometric metal oxide layer, so as to create a defect gradient from the stoichiometric metal oxide layer to the non-stoichiometric metal oxide layer, and a second electrode disposed on the non-stoichiometric metal oxide layer.

Embodiments of the invention may further provide a resistive nonvolatile memory element that includes a first electrode, a stoichiometric metal oxide layer disposed on the first electrode, a defect layer disposed on the stoichiometric metal oxide layer, the defect layer comprising alternating layers of the stoichiometric metal oxide layer and non-stoichiometric metal oxide layers, wherein the distance between said alternating layers of stoichiometric metal oxide layer and non-stoichiometric metal oxide layers decreases in a direction away from the first electrode so as to create an vacancy gradient within the defect layer and a second electrode disposed on the defect layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3C are schematic illustrations of a memory cell before, during and after an electro-forming process.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to a resistive switching nonvolatile memory element that is formed in a resistive switching memory device that may be used in a memory array to store digital data. The memory element is generally constructed as a metal-insulator-metal stack. The resistive switching portion of the memory element includes a getter portion and/or a defect portion. In general, the getter portion is an area of the memory element that is used to help form, during the resistive switching memory device's fabrication process, a region of the resistive switching layer that has a greater number of vacancies or defects as compared to the remainder of resistive switching layer. The defect portion is a formed region or area of the memory element that has a greater number of vacancies or defects as compared to the remainder of the resistive switching layer. The addition of the getter or defect portions in a formed memory device generally improves the reliability of the resistive switching memory device, improves the switching characteristics of the formed memory device and can eliminate or reduce the need for the time consuming additional post fabrication "burn-in" or pre-programming steps, often known as "forming" process steps, and referred to herein as "electrical forming" process steps.

Figure 1:
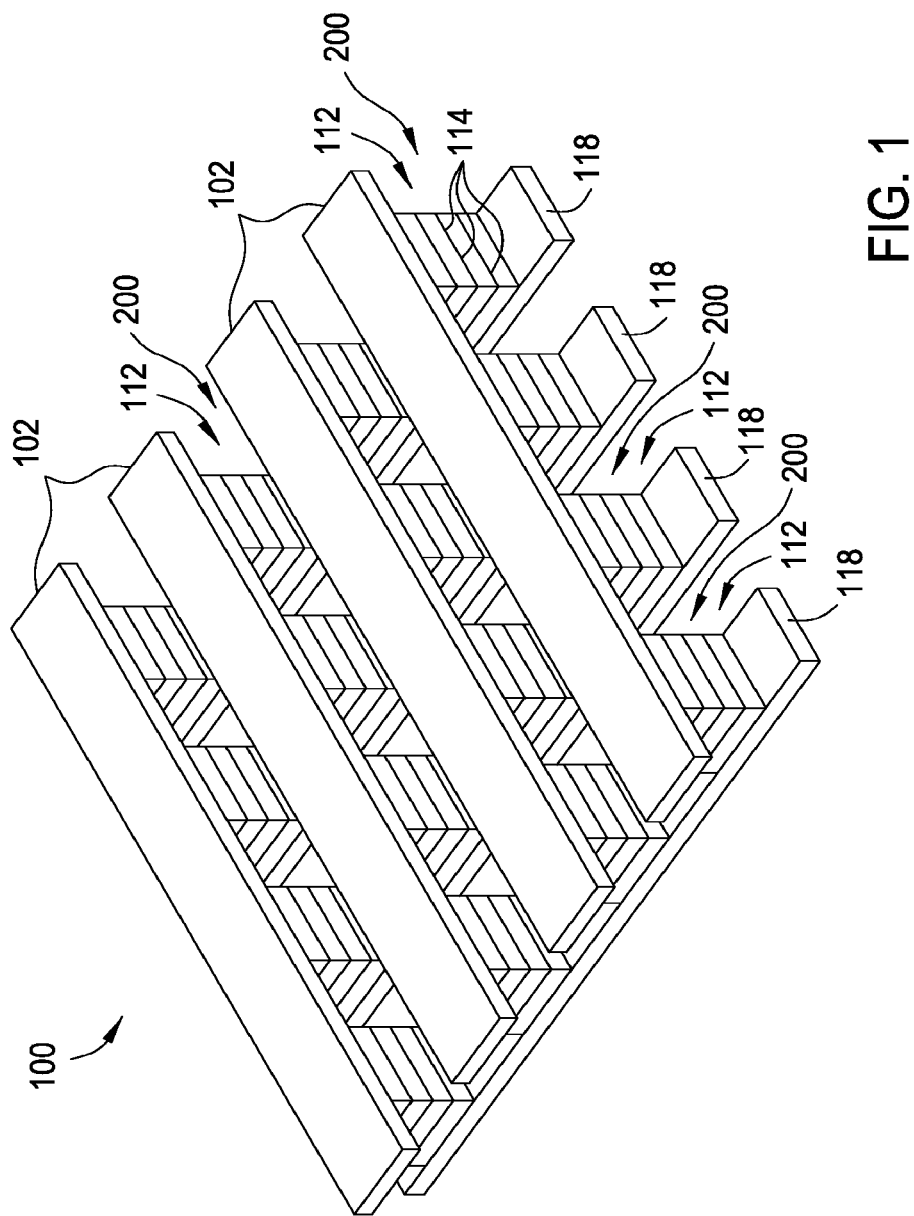
FIG. 1 illustrates an array of resistive switching memory elements in accordance with an embodiment of the invention.

An illustrative memory array 100 of nonvolatile resistive switching memory devices 200, which each generally include at least one resistive switching memory element 112, is illustrated in FIG. 1. Memory array 100 may be part of a larger memory device or other integrated circuit structure, such as a system on a chip type device. Read and write circuitry is connected to resistive switching memory devices 200 using electrodes 102 and orthogonal electrodes 118. Electrodes, such as electrodes 102 and electrodes 118, are sometimes referred to as word lines and bit lines, and are used to read and write data into the memory elements 112 in the switching memory devices 200. Individual switching memory devices 200 or groups of switching memory devices 200 can be addressed using appropriate sets of electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figure 2C:
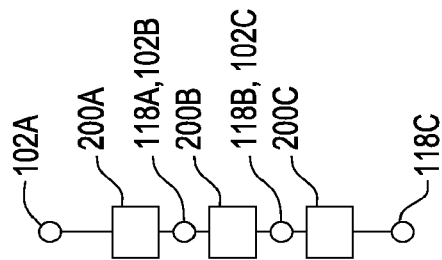
FIG. 2C is schematic representation of an array of memory devices in accordance with an embodiment of the invention.
Figure 2B:
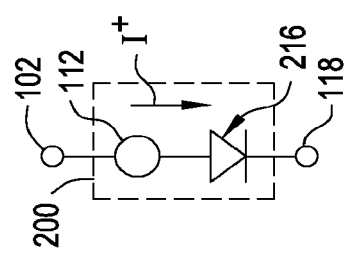
FIG. 2B is schematic representation of a memory device having a diode type current steering element in accordance with an embodiment of the invention.
Figure 2A:
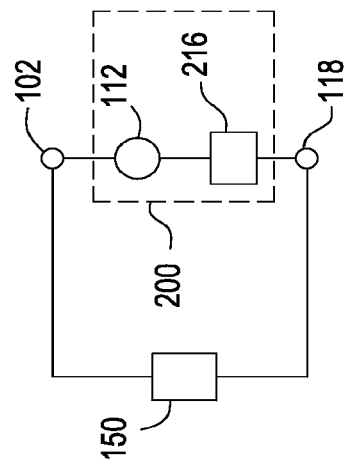
FIG. 2A is schematic representation of a memory device in accordance with an embodiment of the invention.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112.

FIG. 2B schematically illustrates a switching memory device 200 that contains a memory element 112 and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

FIG. 2C schematically illustrates a series array of switching memory devices 200A-200C that may be connected together to form part of a high-capacity nonvolatile memory integrated circuit. As illustrated in FIG. 2C, each of the switching memory devices 200A-200C may be connected internally in a formed chip package, or externally from a formed chip package, by use of the electrodes 102A-102C and 118A-118C.

Figures 2D, 2E:
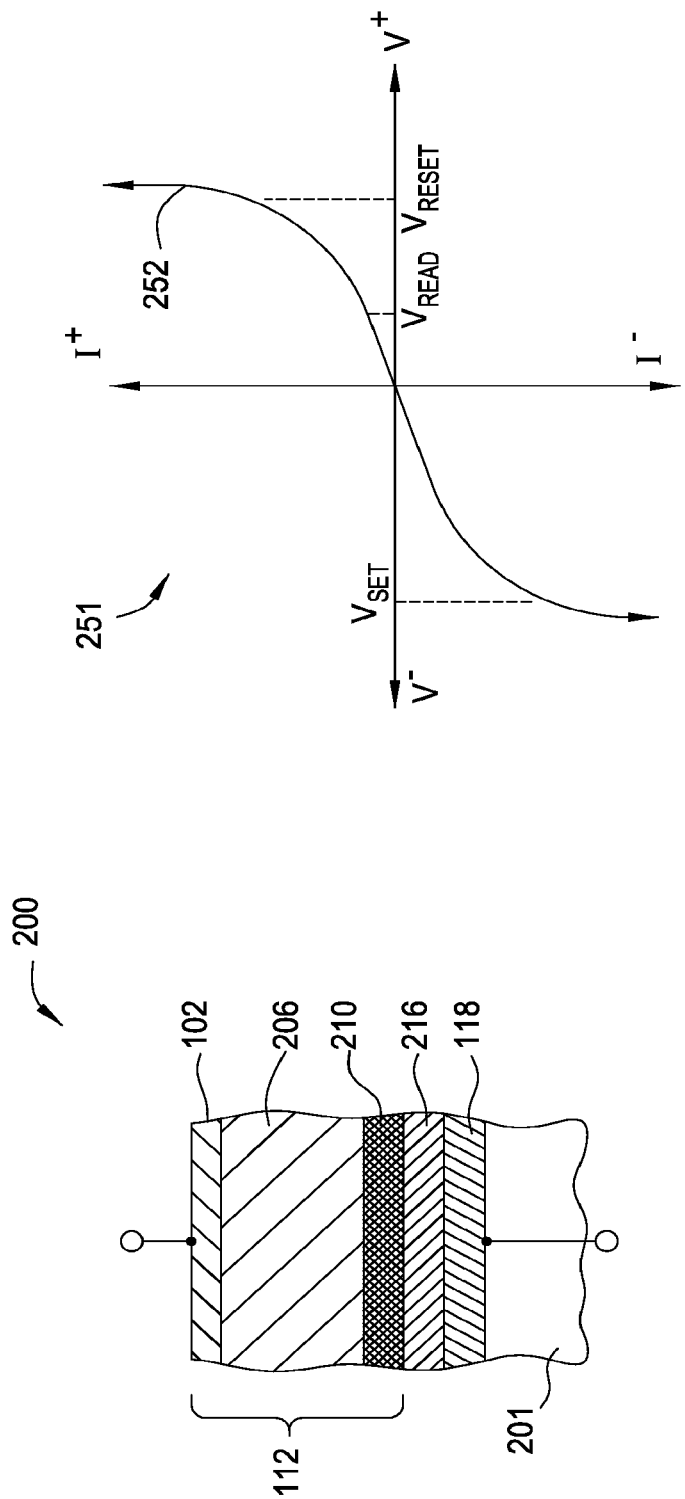
FIG. 2D is a schematic side cross-sectional view of a memory element disposed in a nonvolatile memory device according to an embodiment of the invention.
FIG. 2E is a graph illustrating the current (I) versus voltage (V) characteristics of a bipolar switching type memory element in accordance with an embodiment of the invention.

FIG. 2D is a schematic side cross-sectional view of a switching memory device 200, which contains a memory element 112 and a current steering device 216 that is formed over a substrate 201. In this configuration, the memory element 112 generally contains a top electrode 102, variable resistance layer 206 and intermediate electrode 210. The electrodes 102, 210 and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The variable resistance layer 206 can be a dielectric material that can be switched between at least two or more stable resistive states, and will be discussed in more detail below. In an effort to simplify the discussion of the some of the embodiments of the invention, the discussion below will generally be focus on the memory element 112 portion of the memory device 200. The simplified discussion is not intended to limit the scope of the invention described herein, and thus the various embodiments of the invention described herein can be used or formed within a more complex memory element 112, memory device 200 and/or in a memory array 100 than what is illustrated and discussed below.

During operation, such as a read operation, the state of a memory element 112 in the switching memory device 200 can be sensed by applying a sensing voltage (i.e., a "read" voltage $V_{READ}$ (FIG. 2E)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "one" (i.e., a "1" bit). If, on the other hand, the memory element is in the low resistance state, the memory element may be said to contain a logic "zero" (i.e., a "0" bit). During a write operation, the state of a memory element can be changed by application of suitable write signals to an appropriate set of electrodes 102 and 118.

In some embodiments, the memory element 112 uses bipolar switching where opposite polarity "set" and "reset" voltages are used to alter the resistance of the memory element between high and low resistance states. FIG. 2E schematically illustrates a log-log plot of current (I) versus voltage (V) (e.g., reference numeral 251) of one example of a bipolar switching curve 252 of a resistive switching type of memory element, and thus illustrates typical threshold values used to "set" and "reset" the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −2 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated"), or defects, in the resistive switching layer, or variable resistance layer 206 (FIG. 2D), when the device is reverse biased. The defects or traps, which are commonly formed during the deposition or initial "burning-in" of the variable resistance layer 206, are often created by a non-stoichiometric material composition found in the formed variable resistance layer 206. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +2 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 ms to 1 ns square or trapezoidal shaped pulse can be used to switch the memory element 112. In some embodiments, it may be desirable to adjust the length of the pulse depending on the amount of time needed to switch the memory element 112. While the discussion of the memory element 112 herein primarily provides bipolar switching examples, some embodiments of the memory element 112 may use unipolar switching, where the set and reset voltages have the same polarity, without deviating from the scope of the invention described herein.

In a conventional resistive switching memory device manufacturing process, additional post fabrication processing steps are commonly required to prepare the memory element 112 for use. Typically, these additional processing steps, such as the "electrical forming" process require the application of a forming voltage ($V_{FORM}$) at least once across the electrodes 102, 118 to "burn-in" the device, as briefly discussed above. It is believed that the application of a forming voltage, which is typically significantly greater than the $V_{RESET}$ and $V_{SET}$ voltages, creates vacancy type defects in the variable resistance layer 206, which help improve the resistive switching properties of the formed device, and causes the vacancy defects that are formed within the variable resistance layer to move, align and/or collect within various regions of the layer.

During the "electrical forming" process a forming current or forming voltage is applied across the electrodes 102 and 118 formed in the resistive switching memory device 200. Due to the applied current or voltage, negative ions move towards the anode electrode and positively charged ion vacancies concentrate near the cathode electrode. As more ions move, more vacancies are created adjacent the cathode electrode and more negative ions concentrate adjacent to the anode electrode. While not intending to limit the scope of the invention described herein, in general, the "electrical forming" process is performed by flowing a current through the memory element 112 in single "favorable" direction, thus making one electrode typically the cathode during this process and the other electrode typically the anode. The "favorable" current flow direction is typically selected for each type of memory device because of the improved resistive switching characteristics achieved by flowing the electrical forming current through the device in one direction versus another.

FIGS. 3A-3C are schematic illustrations of a memory element 112 before, during and after an "electrical forming process." In FIG. 3A, the memory element 112 is shown to have an electrode 102 and a intermediate electrode 210 spaced therefrom by the variable resistance layer 306. Within the variable resistance material, the ion vacancies 308 are shown to be substantially evenly distributed.

It is believed that when an electric field or current is applied across the electrodes that are disposed on either side of a metal oxide containing variable resistance layer 306, the negative ions move towards the positively biased electrode 210, and the vacancies 308 tend to concentrate near the negatively biased electrode 102. In other words, the location of the vacancies 308 shift as shown by arrow 110 towards the negatively biased electrode 102 and away from the electrode 210, as shown in FIG. 3B. The shift occurs because the ions move towards the electrode 210 and create vacancies 308 in the locations where the ions were originally positioned in the variable resistance layer 306. As more ions move from sites in the variable resistance layer 306, more vacancies 308 are created adjacent the electrode 102 and more vacancies 308 are filled adjacent the electrode 210. The electric field that is applied to move the ions may be in excess of 12 MV/cm. Once the "electrical forming" process is completed, the vacancies 308 are concentrated in an area 312 that is adjacent the electrode 102. The area 312 has a greater vacancy concentration as compared to area 314 that is adjacent the first electrode 314. The dashed line represents the approximate boundary between the areas 312 and 314; however, it is to be understood that there will be no clear demarcation between the areas 312 and 314 in practice. When the vacancies 308 are concentrated adjacent the electrode 102, the area 312 functions as a virtual electrode that effectively makes the variable resistance layer 306 thinner. A virtual electrode is a material region that has a low resistance, and thus acts as an electrically leaky dielectric material.

This "electrical forming" process thus causes the variable resistance layer 306 to more consistently and reliably switch between the "on" and "off" resistive states throughout the memory element's life. In one configuration, the forming voltage is between about 1.4 and about 5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required to reduce the complexity of the manufacturing process, reduce the length of the memory device manufacturing process and reduce the possibility of physically harming the material found in the variable resistance layer during the application of the forming voltage.

Therefore, in one embodiment of the invention, rather than creating vacancy type defects within the variable resistance layer by applying a forming voltage, getter or defect containing regions are formed during the memory element fabrication process to create a desired vacancy density (e.g., vacancies/cm$^3$) or defect density (e.g., defects/cm$^3$) within desired locations in the memory device to improve the resistive switching properties of the formed memory device. The added getter regions in the memory device have an affinity for freely available ions and thus create vacancies within the variable resistance layer formed between the first and second electrodes in an area adjacent to the getter portion. The getter or defect containing portion, acts as a virtual electrode that is physically produced during the device fabrication process.

Single Getter Layer

Figure 4:
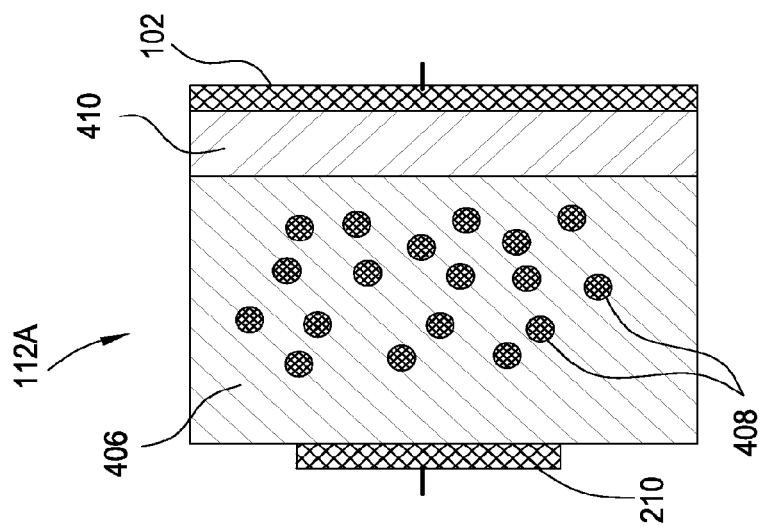
FIG. 4 is a schematic illustration of a memory cell according to one embodiment.

FIG. 4 is a schematic illustration of a memory element 112A formed in a resistive switching memory device 200 according to one embodiment of the present invention. In one embodiment, the memory element 112A comprises an electrode 102, a variable resistance layer 406, an electrode 210 and a getter layer 410, which is disposed adjacent to the variable resistance layer 406. In one example, as shown in FIG. 4, the getter layer 410 is formed between the variable resistance layer 406 and the electrode 102.

As shown in FIG. 4, the variable resistance layer 406 is disposed between the electrode 102 and the electrode 210. The formed variable resistance layer 406 generally contains a plurality of ion vacancies 408, such as oxygen vacancies or nitrogen vacancies that are dispersed throughout the variable resistance layer 406. The ion vacancies 408 formed in the variable resistance layer 406 may have an average vacancy concentration or vacancy density (e.g., vacancies/cm$^3$) that is relatively uniform throughout the variable resistance layer 406 after the variable resistance layer 406 formation or deposition process. In one embodiment, the variable resistance layer 406 comprises a metal oxide. The variable resistance layer 406 is a dielectric material, such as a metal oxide material or other similar material that can be switched between at least two or more stable resistive states. In some embodiments, the variable resistance layer 406 is a high bandgap material (e.g., bandgap >4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). It has been found that using high band gap variable resistance layer materials will improve data retention in a memory element 112, and reduce the leakage current in the formed memory element device, since the amount of trapped charge in the variable resistance layer material will be less than a lower band gap material, and the high band gap materials create a large barrier height that the carriers have to cross during the read, set and reset operations. In other embodiments, lower bandgap metal oxide materials can be used, such as titanium oxide ($TiO_x$), nickel oxide ($NiO_x$) or cerium oxide ($CeO_x$) may be advantageous for some embodiments. In some cases, a semiconductive metal oxide (p-type or n-type) such as zinc oxides ($Zn_xO_y$), copper oxides ($Cu_xO_y$), and their non-stoichiometric and doped variants can be used. In one configuration, the variable resistance layer 406 comprises a metal oxide (e.g., $HfO_2$) layer formed to a thickness of between about 10 and about 100 angstroms. The variable resistance layer 406 may be deposited by well known deposition methods such as CVD, ALD, PECVD and PVD.

The getter layer 410 generally comprises a material having an affinity for at least one of the chemical elements in the variable resistance layer 406, so that vacancies, defects or traps are formed in the variable resistance layer 406 during the resistive switching memory device fabrications process without need for the electrical forming process steps (e.g., no need for the application of a forming voltage). In one configuration, the getter layer 410 has a greater affinity for oxygen or nitrogen as compared to the other components in the variable resistance layer 406, such as hafnium, tantalum or aluminum, for example. In one example, during one of the memory element 112A formation process processing steps, oxygen ions (e.g., $O^{2-}$) diffuse to and react with the material in the getter layer 410, and thus form oxygen vacancies in a hafnium oxide ($Hf_xO_y$) containing variable resistance layer 406. Suitable materials that may be used to form the getter layer 410 include metals such as titanium, aluminum and combinations thereof.

The getter layer 410 creates a vacancy gradient between the electrodes 102, 210, because of the getter layer material's affinity for at least one of the chemical elements in the variable resistance layer 406 material, thus causing a greater density of vacancies 408 to form and/or concentrate in the variable resistance layer 406 in an area adjacent the getter layer 410. Because the vacancies 408 concentrate in an area adjacent the getter layer 410, a virtual electrode can be created without the application of a forming voltage, and thus an "electrical forming" process need not be performed on the formed memory element 112A to assure that the memory device reliably functions throughout its life. However, if desired, a smaller forming voltage, as compared to a conventional forming voltage may be applied after the device is produced, such as up to about 10 MV/cm, to reposition vacancies within the variable resistance layer 406 and/or create additional vacancies 408 closer to the getter layer 410 and away from the electrode 210.

In one embodiment, the material used to form the getter layer 410 is selected so that the defect density or vacancy concentration in the getter layers 410 remains relatively constant throughout the life of the memory device 200, and thus the resistance of the getter layer 410 itself does not appreciably change during either the $V_{SET}$ or the $V_{RESET}$ programming steps. In one example, the getter layer 410 comprises a material that is not a dielectric material.

The getter layer 410 may be deposited by well known deposition methods such as PVD, ALD and CVD or chemical reactions such as a chemical oxide process or an electrochemical metallization process. The getter layer 410 is deposited at a deposition temperature of between about 25° C. and about 300° C. to a thickness of up to about 75 angstroms, such as about 25 angstroms. In some cases, if the getter layer 410 is deposited to a thickness that is too large, the resistance of the layer can affect one's ability to sense the resistance change in the variable resistance layer 406, and also create diffusion related defects in the variable resistance layer 406 and the memory device 200. In cases where the getter layer is deposited to too great a thickness, it is believed that portions of the getter layer 410 material will tend to diffuse into and create a filamentary path in the variable resistance layer 406 during the deposition and/or fabrication processes. The formed filamentary path can thus create an electrical short through the formed variable resistance layer 406, which can lower the yield of the memory devices 200 in the memory array 100.

In one embodiment, the electrode 210 is n-doped polysilicon, however, it is to be understood that other electrically conductive materials may be utilized for the electrode 210 such as titanium nitride, silicon, silicides, nickel, platinum, iridium, iridium oxide, ruthenium, n-doped polysilicon, p-doped polysilicon, and ruthenium oxide. The memory element 112A also includes an electrode 102 that may comprise titanium nitride, for example, but it is to be understood that other electrically conductive material may be utilized, such as n-doped polysilicon, silicon, silicides, nickel, platinum, iridium, iridium oxide, tantalum, aluminum, titanium, ruthenium, n-doped polysilicon, p-doped polysilicon, and ruthenium oxide. Additionally, while the electrode 102 and the electrode 210 typically comprise different materials, it is contemplated that the same material may be used for both the electrodes 102, 210. It is also contemplated that the first and second electrodes 102, 210 may comprise multiple layers or layers of graded composition. Both the electrode 102 and the electrode 210 may be produced by well known methods. As one example, an electrically conductive material is first deposited on a substrate and then patterned by conventional processes. Suitable deposition methods that may be utilized include chemical vapor deposition (CVD), plasma enhanced chemical vapor deposition (PECVD), atomic layer deposition (ALD) and physical vapor deposition (PVD). Suitable patterning methods that may be utilized include the use of lithography, wet etching and/or plasma etching techniques.

After the layers used to form the memory element 112A have been deposited or formed, the memory element 112A may then be thermally processed at a temperature between about 450° C. and about 950° C., such as about 460° C. as an additional measure to cause the mobile ions to diffuse to and react with the getter layer 410 material to ensure a desired amount of vacancies have been formed in a desired region of the variable resistance layer 406. In one configuration, the memory element 112A is thermally processed at a temperature greater than about 450° C. During this thermal processing step, the reaction between the getter layer 410 material and the mobile ions will tend to create an ion deficient region near the interface of the getter layer 410 and the variable resistance layer 406 material, causing a net diffusion of ions towards the getter layer 410. The diffusion and reaction of the mobile ions with the getter layer material 410, thus creates a higher density of vacancies near the interface of the getter layer 410 and the variable resistance layer 406. The annealing process may occur for a time period of between about 30 seconds and about 20 minutes, so that a desirable density of vacancies are formed in the variable resistance layer 406.

Interleaved Getter Layers

Figure 5:
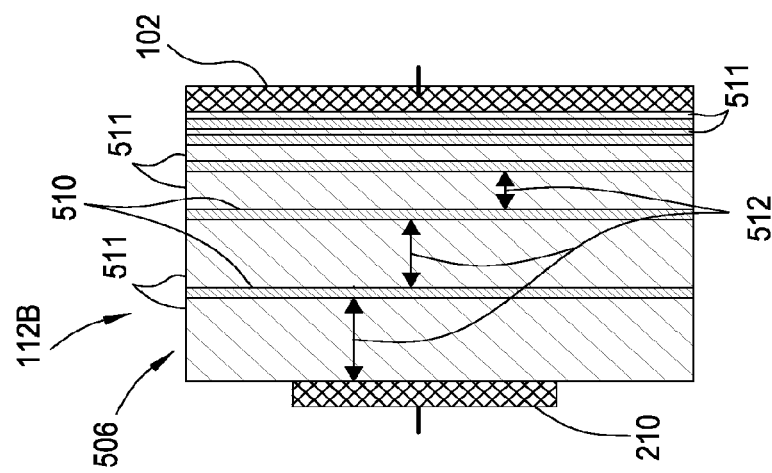
FIG. 5 is a schematic illustration of a memory cell according to another embodiment.

FIG. 5 is a schematic illustration of a memory element 112B formed in a resistive switching memory device 200 according to one embodiment of the present invention. The memory element 112B includes an electrode 102 and an intermediate electrode 210, which are discussed above, and a variable resistance layer 506. The variable resistance layer 506 generally comprises a series of formed or deposited layers to enhance the resistive switching properties of the formed memory element device 200. In one embodiment, the variable resistance layer 506 comprises one or more getter layers 510 that are each disposed between layers of the variable resistance material 511. In one embodiment, the variable resistance material 511 comprises a material similar to a material that is used to form the variable resistance layer 406, which is discussed above, and thus will not re-discussed here again. However, in one example, the variable resistance material 511 comprises a high bandgap material (e.g., bandgap >4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The variable resistance material 511 may be deposited by well known deposition methods such as CVD, ALD, PECVD and PVD deposition techniques.

As noted above, a getter layer, such as the getter layers 510 shown in FIG. 5, generally comprises a material that has a greater affinity for at least one of the chemical elements in the variable resistance material 511 (e.g., oxygen, nitrogen) as compared to the bulk material found in the variable resistance layer material itself (e.g., reference numeral 511). Suitable materials that may be used to form a getter layer 510, may include metals such as titanium, aluminum and combinations thereof. The getter layer 510 may be deposited by any well known deposition methods, such as PVD, ALD and CVD or processing techniques. In some cases the getter layer 510 may be formed by use of a chemical oxidation process or an electrochemical metallization process. A typical chemical oxidation process on a silicon containing layer may include the following steps: 1.) removing the native oxide layer by dipping the substrate in a room temperature 100:1 aqueous HF containing solution for about 60 seconds, and then 2.) exposing the substrate to a solution comprising an SC1 containing solution at a concentration of 1:1:40 at a temperature of about 35° C. for about 10 minutes to achieve a grown oxide thickness of between about 4.5 angstroms.

During the variable resistance layer 506 formation process, or during subsequent processing steps (e.g., thermal processing steps), the one or more getter layers 510 are used to form vacancies in the adjacent layers of variable resistance material 511 by gettering the mobile elements found therein. In one example, oxygen ions (e.g., $O^{2-}$) in the variable resistance material 511 diffuse to and react with the material in the getter layer 510 to form oxygen vacancies in an adjacent hafnium oxide ($Hf_xO_y$) containing variable resistance material 511. It is noted that vacancies will be formed near the interface of the getter layer 510 material and the variable resistance material 511, and thus will generally form on either side of a getter layer 510 that is disposed between two layers of the variable resistance material 511. In one example, oxygen vacancies are formed in a region of the variable resistance material 511 near the interface of the getter layer 510 (e.g., Al or Ti containing layer) and variable resistance material 511 (e.g., $HfO_x$ containing layer) during the getter layer 510 deposition process and/or during a subsequent thermal processing step.

In one embodiment of the memory device 200, the defect density or vacancy concentration in the getter layers 510 themselves remains relatively constant throughout the life of the memory device 200, and thus the resistance of the material in each of the getter layers 510 will not appreciably change during the $V_{SET}$ and $V_{RESET}$ programming steps. In some cases, the getter layers 510 may be used to retain and minimize the movement of the vacancies through the variable resistance layer 506 (e.g., trap the formed vacancies between two getter layers 510) during the "set" or "reset" programming steps, and thus may help improve the electrical performance and repeatability of the formed memory device 200 throughout its life.

In one embodiment, as shown in FIG. 5, the layer thickness 512 of the variable resistance material 511, which is disposed between the getter layers 510, is adjusted to provide a desirable gradient in vacancy density, or defect density, between the electrodes 102 and 210. The vacancy gradient between the electrodes 102, 210 is created due to the increase in amount of oxygen vacancies created in a region near each of the surfaces of each the getter layer 510 layers, and the varying layer thickness 512 formed between the getter layers 510. Therefore, referring to FIG. 5, in one embodiment, the variable resistance layer 506 has an increasing vacancy density in a direction extending from electrode 210 to electrode 102, due to the decreasing layer thickness 512 of the variable resistance material 511 as one moves along the direction extending from electrode 210 to electrode 102. The thickness of the variable resistance material 511 disposed between the electrode 210 and a getter layer and between each of the getter layers 510, and between a getter layer 510 and the electrode 102 may decrease the further away one moves from the first electrode 210 as shown. In FIG. 5, the getter layers 510 are shown to have the same thickness for each alternating layer, but it is to be understood that the thickness of the getter layer 510 in each layer need not be identical. For example, the thickness of the getter layer 510 may increase as the layers a formed closer to the electrode 210. Alternatively, it is contemplated that the thickness of the variable resistance material 511 may be substantially the same throughout the memory element 112B while the getter layer 510 thickness decreases from the electrode 102 to the electrode 210.

In one embodiment of the resistive switching memory device 200, as illustrated in FIG. 5, the memory element 112B includes a layer of the variable resistance material 511 that is disposed between the electrode 102 and a first getter layer 510 (i.e., getter layer 510 closest to the electrode 102). In this configuration, to assure that a desirable vacancy or defect gradient is formed throughout the memory element 112B (e.g., vacancy or defect density increases in a direction extending from electrode 210 towards the electrode 102), the electrode 102 may comprise a material that also has an affinity for at least one of the chemical elements in the adjacently positioned variable resistance material 511. Thus, the material in the electrode 102 can be used to form vacancies in the variable resistance material 511 adjacent to the electrode 102 to assure that a desirable vacancy or defect gradient is maintained throughout the memory element 112B. In some configurations, the electrode 102 is formed from the same material as the getter layers 510. However, in some configurations, it is desirable to select an electrode material that is different from the getter layer material so that they can perform their desired function within the memory device, and thus the materials may have different affinities for the chemical elements found in the variable resistance material 511, different work functions and/or different electrical conductivities.

In an alternate embodiment of the resistive switching memory device 200, the memory element 112B may include a getter layer 510 that is disposed between the electrode 102 and a first layer of the variable resistance material 511 (not shown in FIG. 5). This configuration of the memory element 112B may be useful in cases where the material used to form the electrode 102 has a low affinity for the chemical elements disposed in the variable resistance material 511 (e.g., noble metals), and thus generally will not contribute to the formation of the vacancy or defect gradient formation in the variable resistance layer 506 of the memory element 112B. The getter layer 510, which is positioned between the electrode 102 and the first layer of variable resistance material 511, can thus be used to assure that a desirable vacancy or defect gradient is formed in the first layer of the variable resistance material 511, and thus the vacancy or defect gradient is maintained throughout the variable resistance layer 506.

After the various layers in the memory element 112B have been deposited and/or formed, the various formed layers may then be heated to a temperature between about 450° C. and about 950° C., such as about 460° C. as an additional measure to ensure that the material in the getter layers 510 can "getter" mobile ions in the adjacently positioned variable resistance material 511 to form the desired vacancies in the variable resistance material 511. In one configuration, the memory element 112B may then be thermally processed at a temperature greater than about 450° C. The thermal processing step may occur for a time period of between about 30 seconds and about 20 minutes. In some configurations, the memory element 112B is disposed in a controlled processing environment during the thermal processing step, such an environment containing primarily forming gas, nitrogen, oxygen containing gases and/or various inert gases. In one example, the thermal processing step may include heating the memory element 112B, which is disposed in a forming gas environment (e.g., 96% Ar+4% $H_2$), to a temperature of about 750° C. for about 1 minute.

While it is generally desirable to eliminate the need for an electrical forming process, in some cases it may be desirable to apply a much smaller forming voltage than would be utilized in absence of the getter layers 510 to help further assure that the memory device 200 reliably functions throughout its life. If desired, a smaller forming voltage may be applied after the layers in the memory element have been deposited or formed, such as up to about 10 MV/cm, to move vacancies within each individual layer of the variable resistance material 511 closer to an electrode, such as the electrode 102.

Single Defect Layer

Figure 6:
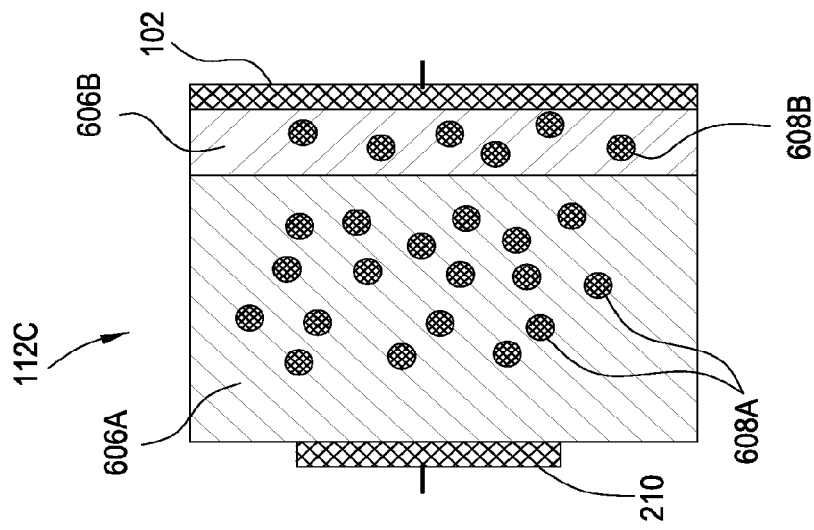
FIG. 6 is a schematic illustration of a memory cell according to another embodiment.

FIG. 6 is a schematic illustration of a memory element 112C according to another embodiment of the invention. The memory element 112C includes an electrode 102 and an intermediate electrode 210, which are discussed above, and a variable resistance layer 606. The variable resistance layer 606 generally comprises two or more formed or deposited layers that enhance the resistive switching properties of the formed memory device 200, and/or reduce the need for the application of a forming voltage to reliably function throughout its life. In one example, as shown in FIG. 6, the variable resistance layer 606 comprises a first variable resistance layer 606A that is adjacent to the electrode 210 and a second variable resistance layer 606B that is adjacent to the electrode 102.

In one embodiment, the variable resistance layer 606A comprises a material that contains a plurality of vacancies that are evenly dispersed throughout the formed material layer. In one embodiment, the variable resistance layer 606A comprises a compositional stoichiometric metal oxide material. Suitable metal oxides may include hafnium oxide ($Hf_xO_y$), tantalum oxide ($Ta_xO_y$), aluminum oxide ($Al_xO_y$), titanium oxide ($Ti_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The variable resistance layer 606A may be deposited by well known deposition methods such as CVD, ALD, PECVD and PVD. The first variable resistance layer 606A may have a thickness of between about 10 angstroms and about 50 angstroms.

In one embodiment, between the first variable resistance layer 606A and the electrode 102, a second variable resistance layer 606B is deposited or formed. In one configuration, the second variable resistance layer 606B contains a material that has a higher average defect or vacancy density than the material in the first variable resistance layer 606A. In some cases, the materials used to form the variable resistance layer 606A affects the choice of material used to form the second variable resistance layer 606B. For example, if the variable resistance layer 606A is an oxygen containing layer, then the second variable resistance layer 606B will be formed so that it is an oxygen deficient layer. Similarly, if the variable resistance layer 606A is a nitrogen containing layer, then the second variable resistance layer 606B will be formed so that it is a nitrogen deficient layer. In one example, the variable resistance layer 606A is formed from a stoichiometric material and the second variable resistance layer 606B is formed from a non-stoichiometric composition of the same material, such as $HfO_2$ and $HfO_{2-x}$, respectively. The second variable resistance layer 606B may have a thickness of between about 5 angstroms and greater than or equal to about 50 angstroms.

In one case, the second variable resistance layer 606B comprises a material having a greater oxygen affinity (or nitrogen affinity) as compared to the variable resistance layer 606A. In one configuration, the second variable resistance layer 606B comprises a non-stoichiometric metal oxide, oxygen vacancy rich layer, non-stoichiometric metal nitride or nitrogen vacancy rich layer. Suitable non-stoichiometric metal oxides that may be utilized include hafnium oxide (e.g., $HfO_{2-x}$), non-stoichiometric aluminum oxide ($Al_xO_y$), non-stoichiometric tantalum oxide ($Ta_xO_y$), non-stoichiometric zirconium oxide ($Zr_xO_y$), non-stoichiometric niobium oxide ($Nb_xO_y$) and non-stoichiometric yttrium oxide ($Y_xO_y$). Additionally, it is to be understood that the variable resistance layer 606A and the second variable resistance layer 606B need not comprise the same materials. As shown in FIG. 6, the second variable resistance layer 606B includes vacancies 608B that are concentrated at a location closer to the second electrode 102 as compared to the opposing edge of the variable resistance layer 606A, due to the method of depositing or forming the second variable resistance layer 606B. Not wishing to be bound by theory, but it is believed that one reason that the combination of the first variable resistance layer 606A and second variable resistance layer 606B can be used to improve the device's switching properties and reduce the need for the electro-forming process, is due to the structure and/or composition of the non-stoichiometric material in the second variable resistance layer 606B, which causes vacancies and/or defects (e.g., reference numeral 608A) to form in a region of the variable resistance layer 606A adjacent to the second variable resistance layer 606B during the manufacturing process.

In another configuration, the second variable resistance layer 606B creates a vacancy gradient between the electrodes 102, 210 because the amount of oxygen (or nitrogen) vacancies 608B is greater in the second variable resistance layer 606B versus the as formed first variable resistance layer 606A. In this case, the second variable resistance layer 606B can have a desirable vacancy or defect density and/or gradient formed therein by controlling the process variables in the deposition or material forming process (e.g., adjusting precursor flow rates, temperature, etc.). The non-stoichiometric material found in the second variable resistance layer 606B can thus create defects or vacancies 608A in an adjacent region of the first variable resistance layer 606A and also contain a quantity of vacancies 608B, which are formed therein during its material formation process. In some cases, it is desirable to form the second variable resistance layer 606B so that its electrical resistance changes during the "set" and "reset" device programming operations, and thus adds to the resistive switching characteristics of the device.

Therefore, the first variable resistance layer 606A and second variable resistance layer 606B can be used to form a virtual electrode during the fabrication of the memory element 112C, and thus in most cases the formed memory element will not require a forming voltage to be applied thereto for it to function properly. However, if desired, a smaller forming voltage (as compared to the forming voltage used for memory element 112) may be applied after the device is produced, such as up to about 10 MV/cm, to move the ions closer to the electrode 210 and create additional oxygen vacancies away from the first electrode 210.

The second variable resistance layer 606B may be deposited by well known deposition methods such as PVD, ALD and CVD or chemical reactions such as a chemical oxide process or an electrochemical metallization process. The second variable resistance layer 606B may be graded so that one of the chemical elements or constituents, such as oxygen (or nitrogen), within the second variable resistance layer 606B changes throughout the formed layer. In one example, the oxygen (or nitrogen) content may be graded by altering the deposition conditions, such as the flow of an oxygen (or nitrogen) containing gas relative to the flow of the other process gas (e.g., precursor gas) into the CVD or ALD deposition chamber, during the second variable resistance layer 606B deposition process. In one configuration, the second variable resistance layer 606B has a thickness that is greater than the thickness of the variable resistance layer 606A.

After the various layers in the memory element 112C have been deposited and/or formed, the various layers may then be thermally processed at a temperature between about 450° C. and about 950° C., such as about 460° C. as an additional measure to ensure that the material in the variable resistance layers 606A, 606B each have a desirable defect or vacancy density. The thermal processing step may occur for a time period of between about 30 seconds and about 20 minutes. In one embodiment, the thermal processing step may occur at 750° C. for about 1 minute.

Interleaved Defect Layers

Figure 7:
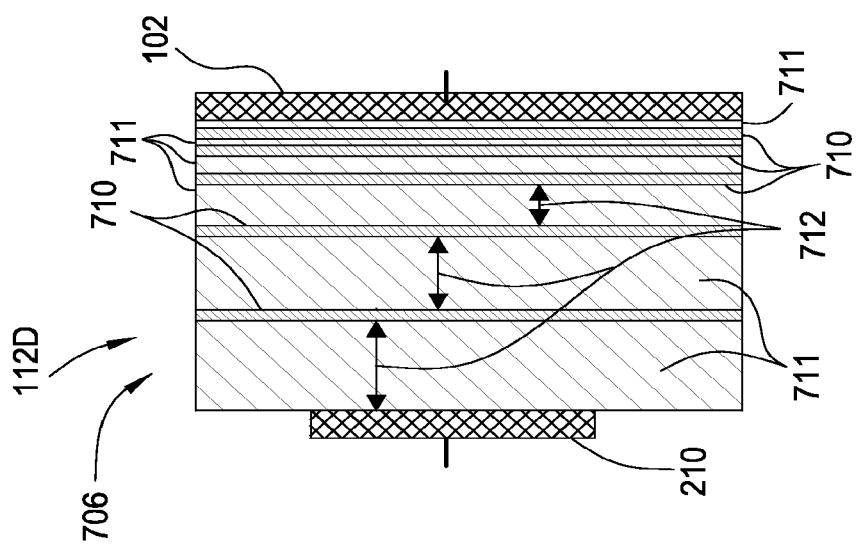
FIG. 7 is a schematic illustration of a memory cell according to another embodiment.

FIG. 7 is a schematic illustration of a memory element 112D formed in a resistive switching memory device 200 according to one embodiment of the present invention. The memory element 112D includes an electrode 102 and an intermediate electrode 210, which are discussed above, and a variable resistance layer 706. The variable resistance layer 706 generally comprises a series of formed or deposited layers that enhance the resistive switching properties of the formed memory device 200. In one embodiment, the variable resistance layer 706 comprises one or more material layers 710 that are each generally disposed between layers of variable resistance material 711. In one embodiment, each of the layers of the variable resistance material 711 comprises a material similar to a material that is used to form the variable resistance layer 406 and/or 606A, and the one or more material layers 710 comprise a material similar to a material that is used to form the second variable resistance layer 606B, which are all discussed above. In one example, the variable resistance material 711 and material in the one or more material layers 710 may comprise a material such as hafnium oxide ($Hf_xO_y$), tantalum oxide ($Ta_xO_y$), titanium oxide ($Ti_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). In another example, the variable resistance material 711 comprises a stoichiometric metal oxide (e.g., $HfO_2$) and the material in the one or more material layers 710 comprise a non-stoichiometric metal oxide (e.g., $HfO_{2-x}$).

In one embodiment, the vacancy or defect density in each of the layers of variable resistance material 711 are adjusted by the positioning of a material layer 710 adjacent to the layer of variable resistance material 711 to provide a desirable gradient in vacancy density, or defect density, in the variable resistance layer 706. The vacancy or defect gradient between the electrodes 102, 210 can be at least partially created by an increase in the amount of vacancies or defects created in each of the layers of variable resistance material 711 in a direction extending from one electrode to the other electrode. Therefore, referring to FIG. 7, in one example, the variable resistance layer 706 can have an increasing vacancy density in a direction extending from the electrode 210 to electrode 102, at least partially due to the increasing vacancy or defect density created in each layer of variable resistance material 711, due to the material properties (e.g., material composition) of the interleaved material layers 710.

Alternately, the vacancy or defect density in one or more of the interleaved material layers 710 may be graded so that the missing chemical element or constituent, such as oxygen (or nitrogen), within the material in the material layers 710 changes throughout the layer. In one example, the oxygen (or nitrogen) content in the interleaved material layers 710 may be graded by altering the deposition conditions, such as the flow of oxygen (or nitrogen) containing gas into the deposition chamber, during the deposition process.

In one embodiment, as shown in FIG. 7, the layer thickness 712 of the layers of variable resistance material 711, which is disposed between the one or more material layers 710, is adjusted to provide a desirable gradient in vacancy density, or defect density, between the electrodes 102 and 210. The vacancy or defect gradient formed between the electrodes 102, 210 can be at least partially created by the formation of vacancies in a region near each of the surfaces of each the material layers 710 during the variable resistance layer 706 formation process or subsequent thermal processing steps. Therefore, referring to FIG. 7, in one embodiment, the variable resistance layer 706 can have an increasing vacancy density in a direction extending from the electrode 210 to electrode 102, at least partially due to the decreasing layer thickness 712 of the variable resistance material 711 as one moves along a direction extending from the electrode 210 to the electrode 102. The thickness of the variable resistance material 711 disposed between the electrodes 102 and 210 and a material layers 710 may decrease the further away one moves from the first electrode 210 as shown. In another configuration, the variable resistance layer 706 can have an increasing vacancy density in a direction extending from the electrode 210 to electrode 102, due to the addition of the material layers 710 and the decreasing layer thickness 712 of the variable resistance material 711 as one moves along a direction extending from the electrode 210 to the electrode 102.

As shown in FIG. 7, the material layers 710 may have the same thickness for each alternating layer, but it is to be understood that the thickness of the material layer 710 in each layer need not be identical. For example, the thickness of the material layer 710 may increase as the layers are formed closer to the electrode 102. Alternatively, it is contemplated that the thickness of the variable resistance material 711 may be substantially the same throughout the memory element 112D while the material layer 710 thickness decreases from the electrode 102 to the electrode 210.

Interleaved Getter and Defect Layers

In another embodiment of the memory element 112D, at least one of the one or more material layers 710 are formed from a material that has an affinity for a chemical element found in the variable resistance material 711 and/or comprises a material that has a resistance that does not appreciably change during either the $V_{SET}$ or the $V_{RESET}$ programming steps, and thus is similar to the getter layers 410 and 510, which are discussed above. In one example, the material layers 710 each comprise a metal selected from the group consisting of titanium, aluminum, and combinations thereof. In this configuration, each of the layers of the variable resistance material 711 may comprise a material similar to a material that is used to form the variable resistance layer 406, 606A and/or 606B, which are discussed above, and thus is not re-discussed here again. However, in one example, the variable resistance material 711 comprises a material such as hafnium oxide ($Hf_xO_y$), tantalum oxide ($Ta_xO_y$), titanium oxide ($Ti_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$).

In one configuration, two or more of the layers of the variable resistance material 711 formed in the variable resistance layer 706 have a differing stoichiometry or defect density to create a desirable defect or vacancy distribution through the variable resistance layer 706. In one configuration, two layers of the variable resistance material 711 in the variable resistance layer 706 comprise the same chemical elements, such as hafnium (Hf) and oxygen (O), but each have a different average compositional stoichiometry relative to each other. In one example, one of the layers of the variable resistance material 711 substantially comprises $HfO_2$ and another layer of the variable resistance material 711 substantially comprises $HfO_{2-x}$ (e.g., $HfO_{1.9}$). Each of the layers of variable resistance material 711 may be deposited by a well known deposition technique, such as a CVD, an ALD, a PECVD or a PVD deposition technique.

In one configuration of the variable resistance layer 706, each of the one or more of the layers of the variable resistance material 711 comprises a first variable resistance layer 606A and a second variable resistance layer 606B, which are discussed above. In this case, the presence of the material layers 710, which act like getter layers 410, 510, and the second variable resistance layer 606B that are both positioned adjacent to a surface of the first variable resistance layers 606A, allows for the formation of a desirable defect density in regions of each of the first variable resistance layers 606A, and a desirable vacancy or defect gradient through the variable resistance layer 706.

In one embodiment, the vacancy or defect density in each of the layers of variable resistance material 711 are adjusted to provide a desirable gradient in vacancy density, or defect density, between the electrodes 102 and 210. The vacancy or defect gradient between the electrodes 102, 210 can be at least partially created by an increase in the amount of vacancies or defects created in each of the layers of variable resistance material 711 in a direction extending from one electrode to the other electrode. Therefore, referring to FIG. 7, in one example, the variable resistance layer 706 can have an increasing vacancy density in a direction extending from the electrode 210 to electrode 102, at least partially due to the increasing vacancy or defect density in each layer of variable resistance material 711 as one moves along a direction extending from the electrode 210 to the electrode 102. The vacancy or defect density in one or more of the layers of variable resistance material 711 may be graded so that the missing chemical element or constituent, such as oxygen (or nitrogen), within the variable resistance material 711 changes throughout the layer. In one example, the oxygen (or nitrogen) content may be graded by altering the deposition conditions, such as the flow of oxygen (or nitrogen) containing gas into the deposition chamber, during the deposition process.

In one embodiment of the variable resistance layer 706, the layer thickness 712 of the layers of variable resistance material 711, which is disposed between the material layers 710, is adjusted to provide a desirable gradient in vacancy density, or defect density, between the electrodes 102 and 210. The vacancy or defect gradient between the electrodes 102, 210 can be at least partially created by the increase in amount of oxygen vacancies created in a region near each of the surfaces of each the material layers 710 during the material layer 710 formation process(es) or subsequent thermal processing steps. Therefore, in one embodiment, the variable resistance layer 706 can have an increasing vacancy density in a direction extending from the electrode 210 to electrode 102, at least partially due to creation of vacancies or defects in region of the variable resistance material 711, due to the presence of the material in the material layers 710 during the manufacturing process, and the decreasing layer thickness 712 of the variable resistance material 711 as one moves along a direction extending from the electrode 210 to the electrode 102, as similarly discussed above Therefore, in any of the configurations discussed above in conjunction with FIG. 7, by alternating the vacancy or defect density in one or more layers of the variable resistance material 711 and disposing material layers 710 between the layers of variable resistance material 711, one can create a desirable defect and/or vacancy density distribution through the variable resistance layer 706. In one configuration, the varying thickness of the variable resistance material 711 disposed between the material layers 710 and the composition stoichiometry within at least a portion of each of the layers of variable resistance material 711 is adjusted to create a desirable oxygen vacancy gradient (or nitrogen vacancy gradient) between the electrodes 102, 210. Therefore, the memory cell 112D may utilize a much smaller forming voltage than would be utilized in absence of the variable defect or vacancy density containing layers of variable resistance material 711 or the addition of the material layers 710 in the variable resistance layer 706. However, if desired, a smaller forming voltage (as compared to the forming voltage used for memory element 112) may be applied after the device is produced, such as up to about 10 MV/cm, to move oxygen ions (or nitrogen ions) and create the oxygen vacancies (or nitrogen vacancies) within each individual layer of the variable resistance material 711.

After the various layers in the memory element 112D have been deposited and/or formed, the various layers may then be thermally processed at a temperature between about 450° C. and about 950° C., such as about 460° C. as an additional measure to ensure that the material in the variable resistance material 711 each have a desirable defect or vacancy density due to the composition stoichiometry of the layers of variable resistance material 711 and the presence of the material layers

710. The thermal processing step may occur for a time period of between about 30 seconds and about 20 minutes. In some configurations, the memory element 112D is disposed in a controlled environment during the thermal processing step, such an environment containing forming gas, nitrogen, oxygen containing gases and/or various inert gases. In one example, the thermal processing step may include heating the memory element 112D, which is disposed in a forming gas environment (e.g., 96% Ar+4% $H_2$), to a temperature of about 750° C. for about 1 minute.

As noted above, by depositing or forming variable resistance layers that have one or more getter layers and/or contain two or more variable resistance containing material layers that have a different defect or vacancy density within a memory device, the electrical forming process can be eliminated, which will increase device throughput, reduce the complexity of the manufacturing process, reduce the length of time required to manufacture the memory device and also reduce the possibility of physically harming the material found in the variable resistance layer during the application of the forming voltage. Additionally, even if a forming process is utilized, the voltage necessary to produce the defect gradient or virtual electrode is significantly reduced as compared to prior art memory cells.

While the discussion above relating to the formation of a vacancy or defect gradient that increases in density along a direction extending from electrode 210 to electrode 102 (FIGS. 4-7), this configuration is not intended to be limiting as to the scope of the invention described herein, since varying the orientation or position of one or more of the electrical components (e.g., current steering device 216) in the resistive switching memory device 200 could make it desirable to orient the vacancy or defect gradient in an opposite direction.

In one aspect, a method of forming a nonvolatile memory element can be envisioned. This includes the steps of: depositing a first electrode layer over a surface of a substrate; depositing a first variable resistance layer over the first electrode layer, where the first variable resistance layer comprises a first chemical element and a second chemical element; and depositing a first layer on the first variable resistance layer, and the first layer can be the first chemical element and the second chemical element, wherein a ratio of the first chemical element to the second chemical element in the first layer can be non-stoichiometric. The first chemical element can be oxygen or nitrogen, and the second chemical element can be hafnium, tantalum, titanium, aluminum, lanthanum, yttrium, dysprosium, ytterbium or zirconium. The method can have the further steps of depositing a second variable resistance layer on the first layer, where the second variable resistance layer can be the first chemical element and the second chemical element; and depositing a second layer on the second variable resistance layer, and the second layer can be the first chemical element and the second chemical element, where a ratio of the first chemical element to the second chemical element in the second layer can be non-stoichiometric. The first layer and the second layer can each be a metal selected from the group consisting of titanium, aluminum, and combinations thereof. Additionally, in an aspect, the method can also include the steps of: depositing a second variable resistance layer on the first layer, where the second variable resistance layer can be the first chemical element and the second chemical element. The first chemical element can be oxygen or nitrogen, and the second chemical element can be hafnium, tantalum, titanium, aluminum, lanthanum, yttrium, dysprosium, ytterbium or zirconium. The method can also include the step of depositing a second variable resistance layer on the first layer, where the first variable resistance layer can have a first thickness and the second variable resistance layer can have a second thickness, and the first thickness can be smaller than the second thickness. The method can also be implemented by heating the first variable resistance layer and the first layer to form vacancies in a region of the first variable resistance layer adjacent to the first layer, where a vacancy density in the region of the first variable resistance layer can be greater than the first vacancy density. The first variable resistance layer and the first layer can be made in an environment by heating the first variable resistance layer and the first layer to a temperature greater than about 450° C.

In another aspect, a method of forming a nonvolatile memory element can have the steps of: depositing a first variable resistance layer over a surface of a substrate, where the first variable resistance layer can be a first material that can be a first chemical element and a second chemical element; depositing a first layer on the first variable resistance layer; and depositing a second variable resistance layer on the first layer, where the second variable resistance layer can be a second material that can be the first chemical element and the second chemical element. The first variable resistance layer can have a first thickness and the second variable resistance layer can have a second thickness, and the first thickness can be not equal to the second thickness. The method can have the further step of depositing a first electrode layer on the second variable resistance layer, where the first electrode layer can be a material that can be a greater affinity for the first chemical element as compared to the second material. The first variable resistance layer and the second variable resistance layer can be hafnium oxide, tantalum oxide, aluminum oxide, lanthanum oxide, yttrium oxide, dysprosium oxide, ytterbium oxide or zirconium oxide. The method can have the further steps of: depositing a first electrode on the variable resistance layer; and forming a second electrode between the surface of the substrate and the first variable resistance layer, where the first electrode can be titanium, and the second electrode can be silicon. The first layer can be a metal selected from the group consisting of titanium, aluminum, and combinations thereof. The step of depositing the first variable resistance layer further can be depositing a second layer over the first electrode layer, where the second layer can have the first chemical element and the second chemical element, and a ratio of the first chemical element to the second chemical element in the second layer can non-stoichiometric. The method can also have the step of depositing a third layer on the second layer, where the third layer can have the first chemical element and the second chemical element, and ratio of the first chemical element to the second chemical element in the third layer can be stoichiometric.

While the foregoing is directed to embodiments of the present invention, other and further embodiments of the invention may be devised without departing from the basic scope thereof, and the scope thereof is determined by the claims that follow.

The invention claimed is:
1. A nonvolatile memory element, comprising:
   a first electrode layer;
   a first variable resistance layer disposed over the first electrode layer;
   a first layer disposed on the first variable resistance layer;
   a second variable resistance layer disposed on the first layer; and
   a second electrode layer disposed over the second variable resistance layer, wherein:
the first variable resistance layer and first layer each comprise a first chemical element and a second chemical element; and
the stoichiometry of the first and second chemical elements in the first variable resistance layer is different than the stoichiometry of the first and second chemical elements in the first layer.

2. The nonvolatile memory element of claim 1, wherein the first variable resistance layer has a first thickness and the second variable resistance layer has a second thickness, and wherein the second thickness is greater than the first thickness.

3. The nonvolatile memory element of claim 1, wherein the first variable resistance layer and the second variable resistance layer each comprise hafnium oxide, tantalum oxide, aluminum oxide, lanthanum oxide, yttrium oxide, dysprosium oxide, ytterbium oxide or zirconium oxide.

4. The nonvolatile memory element of claim 1, wherein the first and second chemical elements are selected from a group consisting of hafnium, oxygen and nitrogen.

5. The nonvolatile memory element of claim 1, wherein:
the second variable resistance layer comprises the first chemical element and the second chemical element; and
the stoichiometry of the first and second chemical elements in the first variable resistance layer is different than the stoichiometry of the first and second chemical elements in the second variable resistance layer.

6. The nonvolatile memory element of claim 5, wherein the first and second chemical elements are selected from a group consisting of hafnium, oxygen and nitrogen.

7. The nonvolatile memory element of claim 1, wherein the first electrode layer comprises titanium and the second electrode layer comprises polysilicon, wherein the first variable resistance layer is disposed on the first electrode layer.

8. The nonvolatile memory element of claim 1, wherein the first layer comprises a metal selected from the group consisting of titanium, aluminum, and combinations thereof.

9. The nonvolatile memory element of claim 1, further comprising:
a second layer disposed on the second variable resistance layer; and
a third variable resistance layer disposed on the second layer.

10. The nonvolatile memory element of claim 9, wherein the third variable resistance layer comprises hafnium oxide, tantalum oxide, aluminum oxide, lanthanum oxide, yttrium oxide, dysprosium oxide, ytterbium oxide or zirconium oxide.

11. A nonvolatile memory element, comprising:
a first electrode layer;
a first variable resistance layer disposed over the first electrode layer;
a first layer disposed on the first variable resistance layer;
a second variable resistance layer disposed on the first layer; and
a second electrode layer disposed over the second variable resistance layer,
wherein:
the first and second variable resistance layers each comprise a first material that comprises a first chemical element and a second chemical element; and
the first layer comprises a metal that has a greater affinity for the first chemical element as compared to the first material.

12. The nonvolatile memory element of claim 11, wherein the first variable resistance layer and the second variable resistance layer each comprise hafnium oxide, tantalum oxide, aluminum oxide, lanthanum oxide, yttrium oxide, dysprosium oxide, ytterbium oxide or zirconium oxide.

13. The nonvolatile memory element of claim 11, wherein the first layer comprises a metal selected from the group consisting of titanium, aluminum, and combinations thereof.

14. A nonvolatile memory element, comprising:
a first electrode layer;
a first variable resistance layer disposed over the first electrode layer;
a first layer disposed on the first variable resistance layer;
a second variable resistance layer disposed on the first layer; and
a second electrode layer disposed over the second variable resistance layer,
wherein:
the first variable resistance layer, the second variable resistance layer and the first layer each comprise a first chemical element and a second chemical element; and
the stoichiometry of the first and second chemical elements in the first and the second variable resistance layers is different than the stoichiometry of the first and second chemical elements in the first layer.

15. The nonvolatile memory element of claim 14, wherein the first variable resistance layer and the second variable resistance layer each comprise hafnium oxide, tantalum oxide, aluminum oxide, lanthanum oxide, yttrium oxide, dysprosium oxide, ytterbium oxide or zirconium oxide.

16. A nonvolatile memory element, comprising:
a first electrode layer;
a first variable resistance layer disposed over the first electrode layer;
a first layer disposed on the first variable resistance layer;
a second variable resistance layer disposed on the first layer;
a second electrode layer disposed over the second variable resistance layer; and
a second layer,
wherein the second variable resistance layer is disposed between the first layer and second layer, and the first and second layers each comprise a metal selected from the group consisting of titanium, aluminum, and combinations thereof.

17. The nonvolatile memory element of claim 16, wherein the first variable resistance layer and the second variable resistance layer each comprise hafnium oxide, tantalum oxide, aluminum oxide, lanthanum oxide, yttrium oxide, dysprosium oxide, ytterbium oxide or zirconium oxide.

18. A nonvolatile memory element, comprising:
a first electrode layer;
a first variable resistance layer disposed over the first electrode layer;
a first layer disposed on the first variable resistance layer;
a second variable resistance layer disposed on the first layer;
a second electrode layer disposed over the second variable resistance layer; and
a second layer that is disposed on the second variable resistance layer, wherein the first layer and the second layer each have a thickness that is substantially equal.

19. The nonvolatile memory element of claim 18, wherein the first variable resistance layer and the second variable resistance layer each comprise hafnium oxide, tantalum oxide, aluminum oxide, lanthanum oxide, yttrium oxide, dysprosium oxide, ytterbium oxide or zirconium oxide.

20. The nonvolatile memory element of claim 18, wherein the first and second layers each comprise a metal selected from the group consisting of titanium, aluminum, and combinations thereof.

* * * * *